(12) United States Patent
Gupta et al.

(10) Patent No.: US 11,790,982 B2
(45) Date of Patent: Oct. 17, 2023

(54) CIRCUITS FOR POWER DOWN LEAKAGE REDUCTION IN RANDOM-ACCESS MEMORY

(71) Applicant: Samsung Electronics Co., Ltd., Suwon-si (KR)

(72) Inventors: Ankur Gupta, Bangalore (IN); Manish Chandra Joshi, Bangalore (IN); Parvinder Kumar Rana, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 101 days.

(21) Appl. No.: 17/443,480

(22) Filed: Jul. 27, 2021

(65) Prior Publication Data

US 2022/0028449 A1 Jan. 27, 2022

(30) Foreign Application Priority Data

Jul. 27, 2020 (IN) .............................. 202041032118

(51) Int. Cl.
| | |
|---|---|
| *G11C 11/4093* | (2006.01) |
| *G11C 11/408* | (2006.01) |
| *G11C 5/14* | (2006.01) |
| *G11C 5/06* | (2006.01) |
| *G11C 11/4074* | (2006.01) |

(52) U.S. Cl.
CPC ............ *G11C 11/4093* (2013.01); *G11C 5/06* (2013.01); *G11C 5/14* (2013.01); *G11C 11/4074* (2013.01); *G11C 11/4085* (2013.01)

(58) Field of Classification Search
CPC ............ G11C 11/4093; G11C 11/4074; G11C 11/4085; G11C 5/06; G11C 5/14
USPC ..................................................... 365/189.05
See application file for complete search history.

(56) References Cited

U.S. PATENT DOCUMENTS

| | | | |
|---|---|---|---|
| 6,459,325 B1 * | 10/2002 | Hall ........................ | H03K 4/00 327/108 |
| 7,810,053 B2 | 10/2010 | Bushnell et al. | |
| 9,947,409 B2 * | 4/2018 | Matsubara ......... | G11C 16/0416 |
| 10,872,654 B1 * | 12/2020 | Lee ..................... | G11C 11/4085 |
| 2005/0201178 A1 | 9/2005 | Ho et al. | |
| 2012/0002499 A1 * | 1/2012 | Kinkade .................. | G11C 5/14 365/227 |
| 2013/0028008 A1 | 1/2013 | Chen et al. | |

* cited by examiner

*Primary Examiner* — Connie C Yoha
(74) *Attorney, Agent, or Firm* — Myers Bigel, P.A.

(57) ABSTRACT

The present invention discloses a wordline driver circuit for a random-access memory (RAM), which can reduce leakage during power down mode. The circuit includes a pre-driver stage on header and footer. The pre-driver stage includes a strap buffer defining a header and comprising a first switch connecting a first set of wordlines to a first voltage. The pre-driver stage includes an input-output buffer defining a footer and comprising a second switch connecting a second set of wordlines to a second voltage. In the pre-driver stage, the strap buffer further includes a third switch connecting the second set of wordlines to the first voltage and a fourth switch connecting the first set of wordlines to the second voltage.

17 Claims, 8 Drawing Sheets

CIRCUITS FOR POWER DOWN LEAKAGE REDUCTION IN RANDOM-ACCESS MEMORY

CROSS-REFERENCE TO RELATED APPLICATION

This application claims priority under 35 U.S.C. § 119 to Indian Patent Application No. 202041032118, filed on Jul. 27, 2020, in the Indian Intellectual Property Office, the disclosure of which is hereby incorporated by reference in its entirety.

FIELD OF THE INVENTION

The present disclosure relates to optimizing memory leakage and, in particular, relates to circuits/systems for power down leakage reduction for drivers in memories.

BACKGROUND

Figure 1:
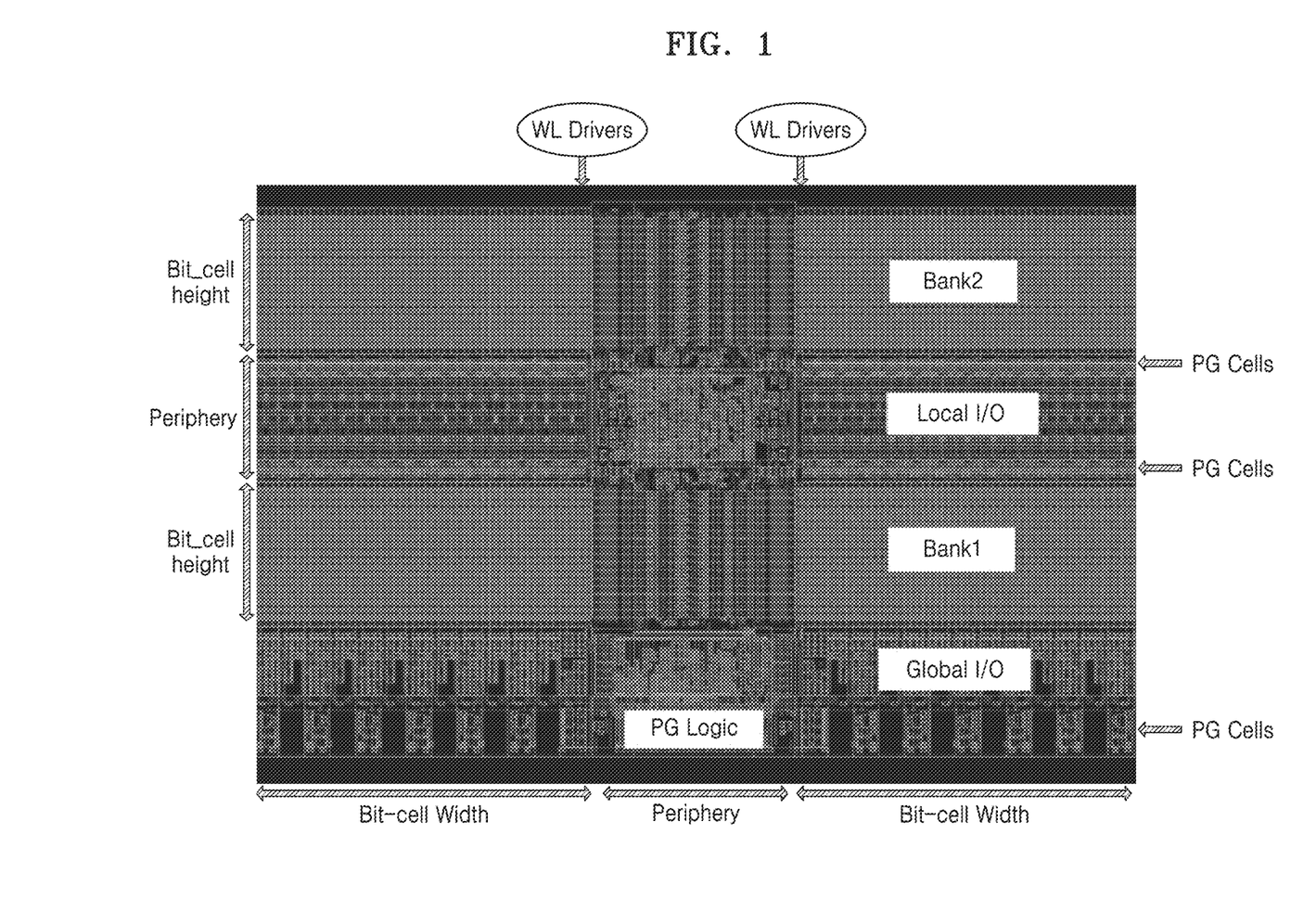
FIG. 1 illustrates an SRAM layout.

Generally, Static random-access memory (SRAM) is used in almost all the SOCs for varying applications like mobile, IoT, Auto etc. and it operates in Active Mode, Retention Mode and Non-Retention/Power-Down Mode. During Active Mode, both power pins VDDPE and VDDCE are always powered up. During Retention Mode, bit-cell power gates are in an ON-state to retain data and the periphery power gates are in an OFF-state. In Non-Retention/Power-Down Mode, both the bit-cell power gates and the periphery power gates are in the OFF-state. FIG. 1 illustrates an SRAM layout.

In SRAM, high drive strength devices are used for driving wordlines which are typically heavily loaded. Isolation logic is used in wordline driver to avoid glitch while powering up periphery in order to come out of retention mode. In general, an alternate footer-header switch logic topology is used, which has significant gate leakage in power down mode.

Table 1 illustrates percentage contribution of drivers towards total power down mode leakage for FinFET based 5LPE SRAM compiler.

TABLE 1

| Instance | Total Power Down Mode Leakage (mA) | Leakage from WL Driver Slice (mA) | % Contribution by WL buffer |
|---|---|---|---|
| 2048 * 80 | 1.89E–03 | 1.13E–03 | 60 |
| 2048 * 160 | 3.32E–03 | 2.18W–03 | 66 |

Figure 2:
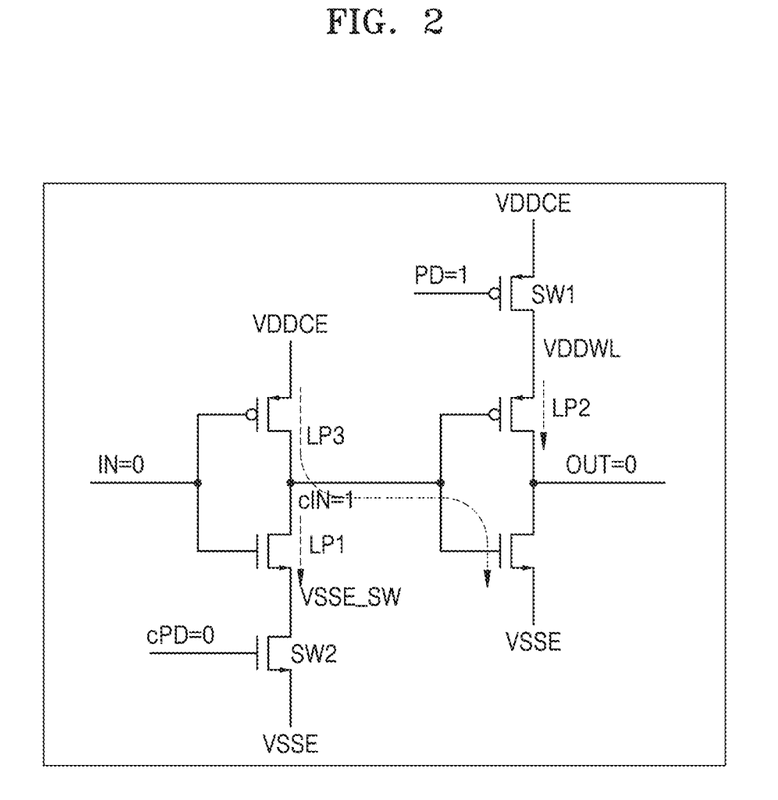
FIG. 2 illustrates a state of the art wordline buffer circuit.

FIG. 2 shows a wordline buffer circuit consisting of two inverter stages: pre-driver and driver. In the circuit, an alternate footer-header switch logic is used and through the path LP1, LP2 and LP3 gate leakage takes place. During Power Down mode, RETN signal is ON, NMOS switch SW2 and PMOS switch SW1 are turned OFF. The input of the pre-driver IN is clamped to zero which further drives output of the driver, OUT to zero in order to avoid glitch at word line during power up. The leakage paths LP1 and LP2 are disconnected using switches SW2 and SW1, respectively. The gate leakage (LP3) through wordline driver is active and constitutes 50-70% of the total leakage in power down mode.

Figure 3:
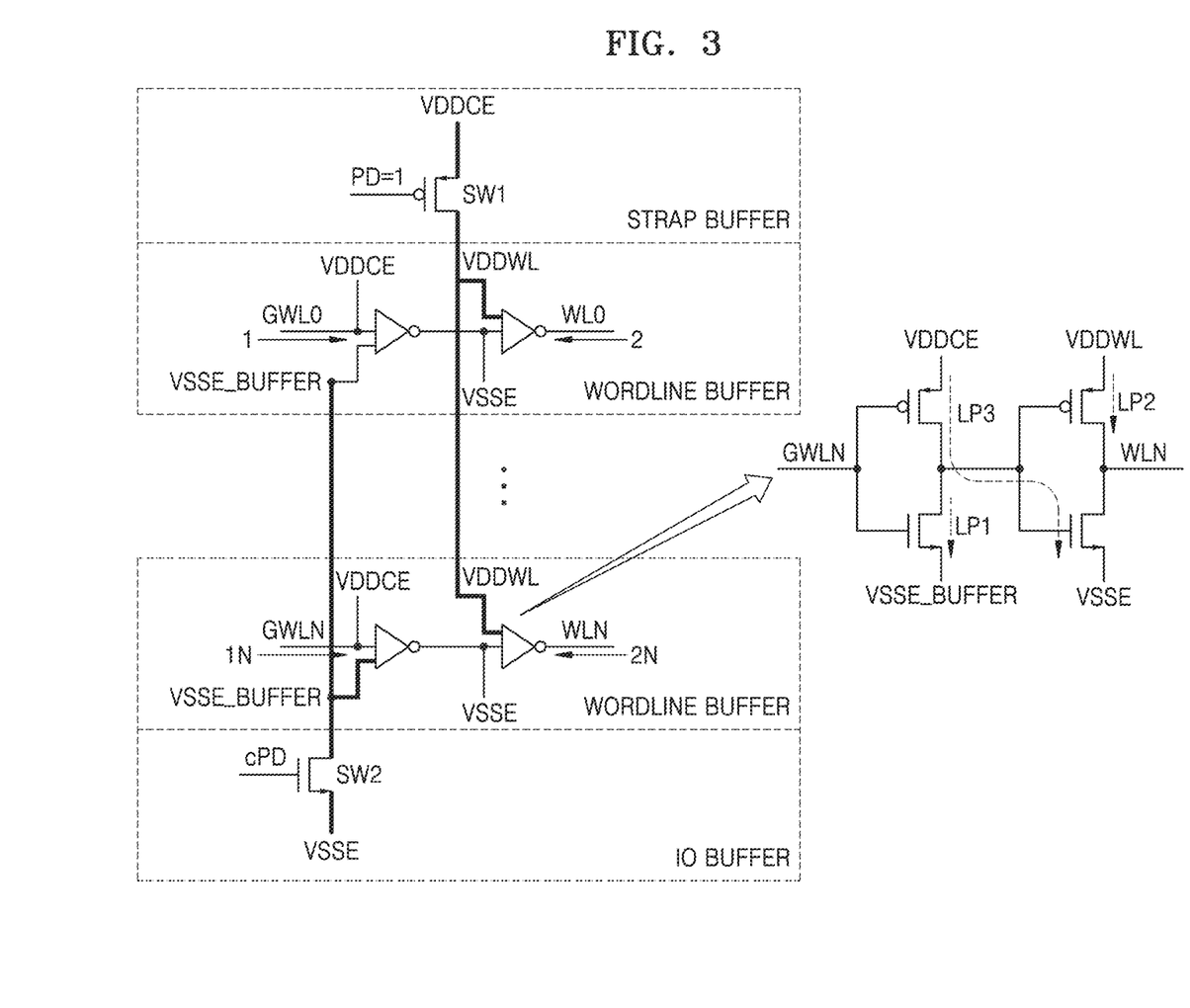
FIG. 3 illustrates a state-of-the-art Buffer Slice Power Management in SRAM.

FIG. 3 illustrates Buffer Slice Power Management in SRAM.

During Active Mode Operation:
Initial Conditions, GWL0 through GWLN=0, PD=0 and cPD=VDDCE;
PMOS SW1 and NMOS SW2 are ON;
NMOS of Inverters 1 to 1N and PMOS of Inverters 2 to 2N are leaking.

During Power Down Mode Operation:
Initial Conditions, GWL0 through GWLN=0, PD=VDDCE and cPD=0;
PMOS switch SW1 and NMOS switch SW2 are turned OFF;
Leakage path LP1 (NMOS) and LP2 (PMOS) are cut-off;
Leakage path LP3 through the NMOS gate of inverters 2 to 2N are ON.

Thus, as can be seen, there exists a need to overcome the aforementioned problem.

SUMMARY OF THE INVENTION

This summary is provided to introduce a selection of concepts in a simplified format that are further described in the detailed description of the invention. This summary is not intended to identify key or essential inventive concepts of the invention, nor is it intended for determining the scope of the invention.

According to some embodiments, a wordline (WL) driver circuit for a random-access memory (RAM) to reduce leakage during power-down mode is disclosed. The circuit includes a pre-driver stage on header and footer. The pre-driver stage includes a strap buffer defining header and comprising a first switch connecting a first set of wordlines (WL) to a first voltage (VDDCE). The pre-driver stage includes an input-output buffer defining footer comprising a second switch connecting a second set of wordlines (GWL) to a second voltage (VSSE). In the pre-driver stage, the strap buffer further includes a third switch (SW3) connecting the second set of wordlines (GWL) to the first voltage (VDDCE) and a fourth switch (SW4) connecting the first set of wordlines (GWL) to the second voltage (VSSE).

According to some embodiments, a method to reduce leakage during power-down mode in a wordline (WL) driver circuit for a random-access memory (RAM) is disclosed. The method includes disconnecting a first set of wordlines (WL) from a first voltage (VDDCE) by turning off a first switch in a strap buffer defining header. The strap buffer is in a pre-driver stage based on header and footer. The method includes disconnecting the second set of wordlines (GWL) from the first voltage (VDDCE) by turning off a third switch (SW3) in the strap buffer. The method includes disconnecting a second set of wordlines (GWL) from a second voltage (VSSE) by turning off a second switch in an input-output buffer defining footer. The input-output buffer is in a pre-driver stage based on header and footer. The method further includes connecting the first set of wordlines (GWL) to the second voltage (VSSE) via a fourth switch (SW4) in the strap buffer.

According to some embodiments, a wordline (WL) driver circuit for a random-access memory (RAM) is disclosed. The wordline driver circuit may include a pre-driver stage including a strap buffer defining a header and an input-output buffer defining a footer. The strap buffer may include a first switch that is configured to disconnect a first set of wordlines from a first voltage during a power down mode and a third switch that is configured to disconnect a second set of wordlines from the first voltage during the power down mode. The input-output buffer may include a second switch that is configured to disconnect the second set of wordlines from a second voltage during the power down mode.

To further clarify the advantages and features of the present invention, a more particular description of the invention will be rendered by reference to specific embodiments thereof, which is illustrated in the appended drawings. It is appreciated that these drawings depict only typical embodiments of the invention and are therefore not to be considered limiting of its scope. The invention will be described and explained with additional specificity and detail with the accompanying drawings.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein.

Further, skilled artisans will appreciate that elements in the drawings are illustrated for simplicity and may not have been necessarily drawn to scale. For example, the flow charts illustrate the method in terms of the most prominent steps involved to help to improve understanding of aspects of the present invention. Furthermore, in terms of the construction of the device, one or more components of the device may have been represented in the drawings by conventional symbols, and the drawings may show only those specific details that are pertinent to understanding the embodiments of the present invention so as not to obscure the drawings with details that will be readily apparent to those of ordinary skill in the art having benefit of the description herein.

DETAILED DESCRIPTION

For the purpose of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated system, and such further applications of the principles of the invention as illustrated therein being contemplated as would normally occur to one skilled in the art to which the invention relates.

It will be understood by those skilled in the art that the foregoing general description and the following detailed description are explanatory of the invention and are not intended to be restrictive thereof.

Reference throughout this specification to "an aspect", "another aspect" or similar language means that a particular feature, structure, or characteristic described in connection with the embodiment is included in at least one embodiment of the present invention. Thus, appearances of the phrase "in an embodiment", "in another embodiment" and similar language throughout this specification may, but do not necessarily, all refer to the same embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more circuits, devices or subsystems or elements or structures or components proceeded by "comprises . . . a" does not, without more constraints, preclude the existence of other circuits, devices or other sub-systems or other elements or other structures or other components or additional devices or additional sub-systems or additional elements or additional structures or additional components.

Unless otherwise defined, all technical and scientific terms used herein have the same meaning as commonly understood by one of ordinary skilled in the art to which this invention belongs. The system, methods, and examples provided herein are illustrative only and not intended to be limiting.

SRAM uses high drive strength devices for driving wordlines which are typically heavily loaded. In the present disclosure, an isolation logic is used in wordline driver to avoid glitch while coming out of retention mode. The present disclosure reduces or optimizes memory leakage in power down mode i.e., reducing or optimizing leakage in power down mode by saving gate leakage. For applications like IoT, SRAM leakage is significant portion of overall SOC leakage. Further, in the present disclosure, SRAM may be construed to cover operation of other RAM such as DRAM, DIMM, NMP-DIMM, SSD etc.

Embodiments of the present subject matter are described below in detail with reference to the accompanying drawings.

Figure 4:
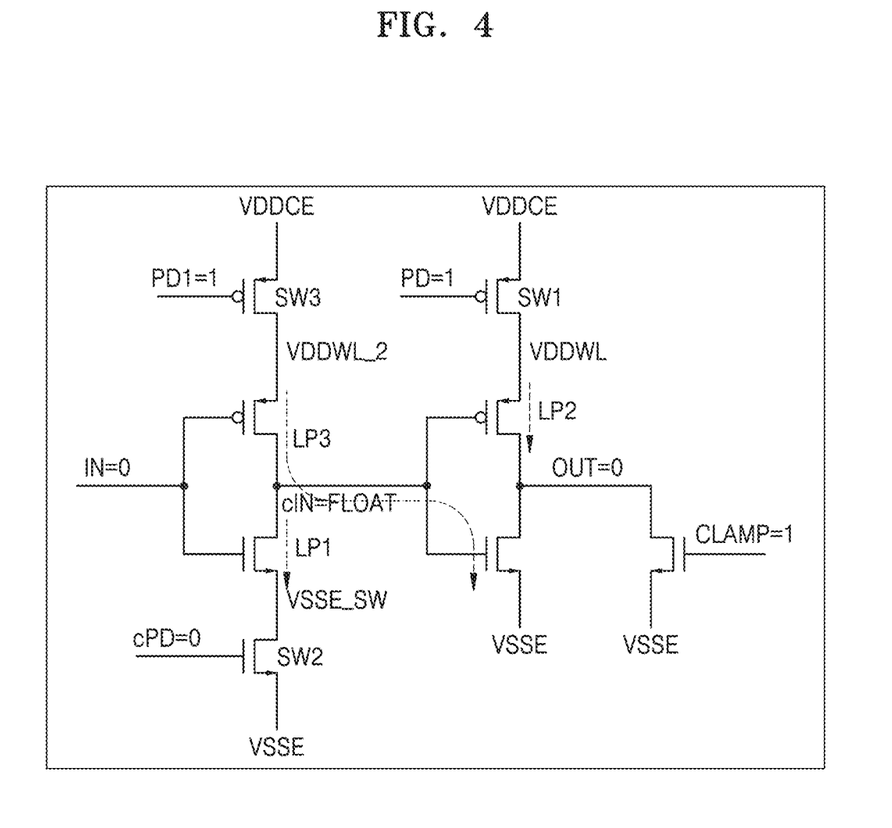
FIG. 4 illustrates a logic circuit, in accordance with an embodiment of the present invention.

FIG. 4 illustrates a logic circuit of SRAM, in accordance with an embodiment of the present invention. In the logic circuit of SRAM, the gate leakage path is cut by adding a switch SW3 to a pre-driver inverter stage. During Power Down mode, IN is still clamped to 0, however, cIN is in floating state since SW3 is OFF. The output of the buffer is clamped to 0 using a NMOS device with input signal (CLAMP) equal to 1. The switch inputs PD and PD1 are controlled via delay circuitry to reduce or avoid a wordline glitch while powering up the periphery.

In an embodiment, when RETN rises from 0 to 1, SRAM switches to active mode. The PD1 signal falls before PD signal falls to ensure that SW3 is switched on before SW1 is switched on. Therefore, this ensures node cIN which was floating during power down mode is driven to logic level 1 before the supply of final WL driver is switched ON, thereby reducing or preventing a glitch at the output of the driver.

In an embodiment, the system of the present invention enables reduction of gate leakage in power down mode. The power down leakage is reduced by 60% at PPA corner as shown in Table 2. Further, there is no area change or timing change due to the system of the present invention.

TABLE 2

| PPA trend | Leakage (in mA) | | | |
| --- | --- | --- | --- | --- |
| | Prior art | Present invention | % Gain | |
| 2048 * 80 | 1.89E−03 | 7.55E−04 | 60 | |
| 2048 * 160 | 3.32E−03 | 1.28E−03 | 61 | |

Figure 5:
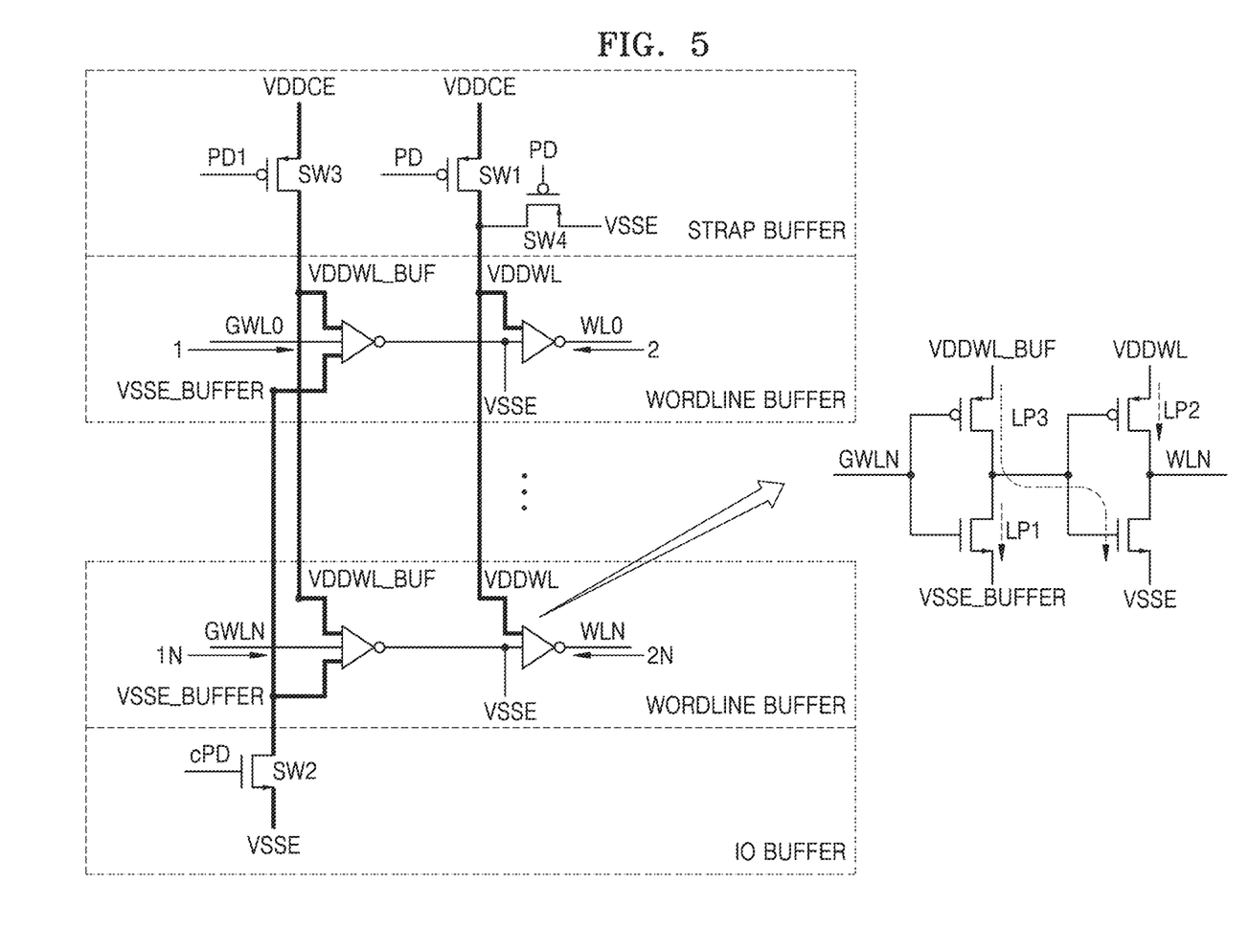
FIG. 5 illustrates a wordline (WL) driver circuit for a random-access memory (RAM), in accordance with an embodiment of the present invention.

FIG. 5 illustrates a wordline (WL) driver circuit for a random-access memory (RAM), in accordance with an embodiment of the present invention. In an embodiment, the circuit includes a pre-driver stage on header and footer. The pre-driver stage includes a strap buffer defining header and comprising a first switch (SW1) connecting a first set of wordlines (WL0 to WLN) to a first voltage (VDDCE). The pre-driver stage also includes an input-output buffer defining footer and comprising a second switch (SW2) connecting a second set of wordlines (GWL0 to GWLN) to a second voltage (VSSE). In the pre-driver stage, the strap buffer further includes a third switch (SW3) connecting the second set of wordlines (GWL0 to GWLN) to the first voltage (VDDCE) and a fourth switch (SW4) connecting the first set of wordlines (WL0 to WLN) to the second voltage (VSSE).

In an embodiment, gate voltages (PD) and (PD1) associated with the switches (SW1) and (SW3) in the strap buffer are operated sequentially via delay circuitry.

In an embodiment, the switching of the third switch (SW3) in the power down stage causes cutting off a leakage path through NMOS gate of inverters within the first set of wordlines (WL0 to WLN).

In an embodiment, the switching of the fourth switch (SW4) in the power down stage is to clamp VDDWL to 0 in the strap buffer.

In an embodiment, during an Active Mode Operation of the present invention:
  Initial Conditions, GWL0 to GWLN=0, PD=0, PD1=0 and cPD=VDDCE;
  PMOS SW1, PMOS SW3 and NMOS SW2 are ON;
  NMOS of Inverters 1 to 1N and PMOS of Inverters 2 to 2N is leaking.

In an embodiment, during Power Down Mode Operation of the present invention:
  Initial Conditions, GWL0 to GWLN=0, PD=VDDCE, PD1=VDDCE and cPD=0;
  PMOS switch SW1, SW3 and NMOS switch SW2 are turned OFF;
  Leakage path LP1 (NMOS) and LP2 (PMOS) are cut-off;
  Leakage path LP3 through the NMOS gate of inverters 2 to 2N is cut-off; and
  PD1 is controlled to reduce or avoid a wordline glitch.

Therefore, a gate leakage path is cut off in power down mode, and PD1 is controlled with respect to PD to reduce or avoid a wordline glitch. In some embodiments, a gate leakage path is open during power down mode.

Figure 6A:
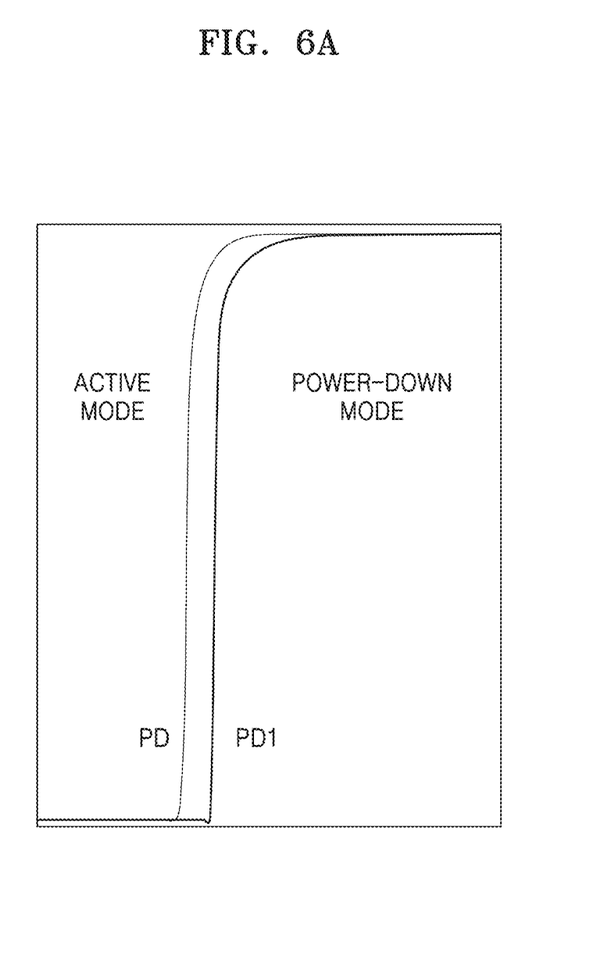
FIGS. 6A and 6B illustrate transition during PD1 control, in accordance with an embodiment of the present invention.
Figure 6B:
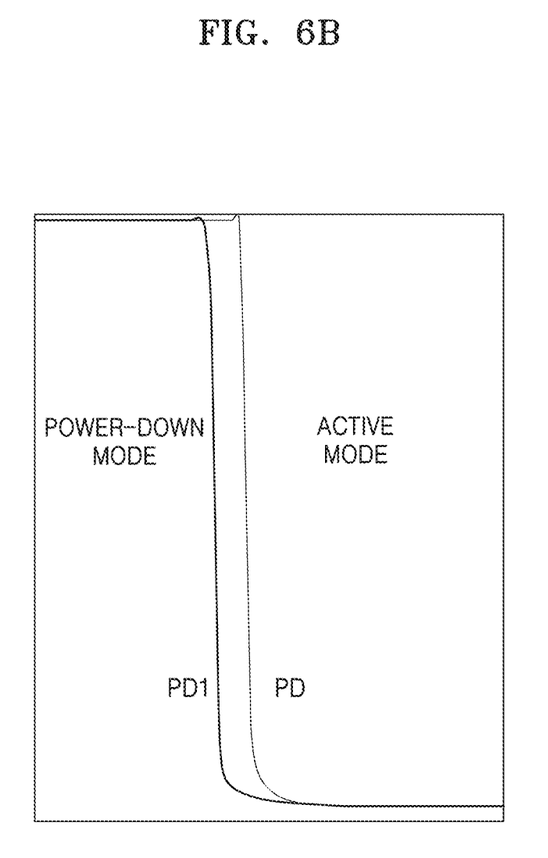

Further, transition during PD1 control is mentioned below in details, as illustrated in FIGS. 6A and 6B.
  Active to Power Down Mode Transition:
  Initial Conditions, PD=0, PD1=0 and cPD=VDDCE;
  PD rises to VDDCE such that a PMOS leakage path is cut-off and VDDWL is clamped to 0;
  PD1 rises to VDDCE after VDDWL is clamped to 0.
  Power Down to Active Mode Transition:
  Initial Conditions, PD=VDDCE, PD1=VDDCE and cPD=0;
  PD1 falls to 0 such that an input of inverters 2N rises to VDDCE and GWLN is clamped to 0;
  PD falls to 0 after VDDWL_BUF rises to VDDCE.

Figure 7:
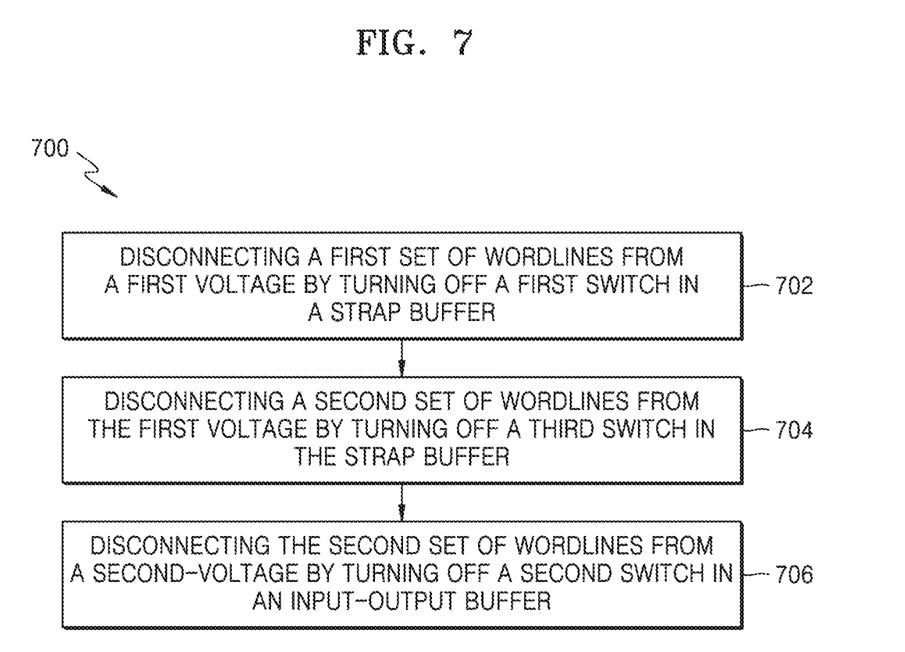
FIG. 7 illustrates a method to reduce leakage during power-down mode in a wordline (WL) driver circuit for a random-access memory (RAM), in accordance with an embodiment of the present invention.

FIG. 7 illustrates a method (700) to reduce leakage during power-down mode in a wordline (WL) driver circuit for a random-access memory (RAM), in accordance with an embodiment of the present invention. At step 702, the method (700) includes disconnecting a first set of wordlines (WL0 to WLN) from a first voltage (VDDCE) by turning off a first switch (SW1) in a strap buffer defining header. In an embodiment, the strap buffer is in a pre-driver stage based on header and footer. At step 704, the method (700) includes disconnecting a second set of wordlines (GWL0 to GWLN) from the first voltage (VDDCE) by turning off a third switch (SW3) in the strap buffer. At step 706, the method (700) includes disconnecting the second set of wordlines (GWL0 to GWLN) from a second voltage (VSSE) by turning off a second switch (SW2) in an input-output buffer defining footer. In an embodiment, the input-output buffer is in the pre-driver stage based on header and footer.

In an embodiment, the method includes connecting the first set of wordlines (WL0 to WLN) to the second voltage (VSSE) via a fourth switch (SW4) in the strap buffer.

In an embodiment, the switching of the third switch (SW3) in the power down stage causes cutting off a leakage path through NMOS gates of inverters within the first set of wordlines (WL0 to WLN). In some embodiments, the third switch (SW3) may open a leakage path through NMOS gates of inverters within the first set of wordlines (WL0 to WLN) during the power down mode.

In an embodiment, the switching of the fourth switch (SW4) in the power down stage is to clamp VDDWL to 0 in the strap buffer.

In an embodiment, gate voltages (PD) and (PD1) associated with the switches (SW1) and (SW3) in the strap buffer are operated sequentially via delay circuitry.

In an embodiment, the method includes performing the sequential operation during active to the power down mode transition by:
  PD=0 and PD1=0 in the strap buffer, and a gate voltage (cPD) associated with the SW2=VDDCE in the input-output buffer;
  initially PD rising to VDDCE in the strap buffer; and
  secondly PD1 rising in the strap buffer to VDDCE subsequent to the raise of PD.

In an embodiment, the method includes performing the sequential operation during the power down mode to active mode transition by:
  PD=VDDCE and PD1=VDDCE in the strap buffer, and cPD=0 in the input-output buffer;
  Initially PD1 falling to 0 in the strap buffer; and
  Secondly PD falling to zero in the strap buffer subsequent to the fall of PD1.

The present invention addresses the problem of how to reduce or optimize leakage in power down mode in a wordline (WL) driver circuit for a random-access memory (RAM).

The advantages of the present invention are:
  Reducing or optimizing leakage in power down mode by saving gate leakage.
  The pre-driver stage (with both header and footer) enables the gate leakage path to cut-off by adding switch(es).
  Providing isolation scheme and switch control sequence to reduce or avoid glitches. The switch inputs PD and PD1 are controlled via delay circuitry to avoid wordline glitch while powering up the periphery.

While specific language has been used to describe the present invention, any limitations arising on account thereto, are not intended. As would be apparent to a person in the art, various modifications may be made to circuits and methods in order to implement the invention as taught herein. The drawings and the foregoing description give examples of embodiments. Those skilled in the art will appreciate that one or more of the described elements may well be combined into a single functional element. Alternatively, certain elements may be split into multiple functional elements. Elements from one embodiment may be added to another embodiment.

What is claimed is:

1. A wordline driver circuit for a random-access memory (RAM) configured to reduce leakage during a power down mode, the wordline driver circuit comprising:
a pre-driver stage comprising:
a strap buffer defining a header and comprising a first switch that is configured to connect a first set of wordlines to a first voltage; and
an input-output buffer defining a footer and comprising a second switch that is configured to connect a second set of wordlines to a second voltage,
wherein the strap buffer further comprises a third switch that is connected between inverters and the first voltage and is configured to connect the second set of wordlines to the first voltage.

2. The wordline driver circuit of claim 1, wherein the third switch is further configured to open a leakage path through NMOS gates of inverters within the first set of wordlines during the power down mode.

3. The wordline driver circuit of claim 1, wherein the strap buffer further comprises a fourth switch that is configured to connect the first set of wordlines to the second voltage.

4. The wordline driver circuit of claim 3, wherein the fourth switch is further configured to clamp VDDWL to 0 during the power down mode.

5. The wordline driver circuit of claim 1, further comprising delay circuitry that is configured to change gate voltages of the first and third switches sequentially during a transition from an active mode to the power down mode and during a transition from the power down mode to the active mode.

6. The wordline driver circuit of claim 5, wherein, during the transition from the active mode to the power down mode:
the second switch is further configured to transition from an on-state to an off-state responsive to a transition of a gate voltage of the second switch from the first voltage to zero;
the first switch is further configured to transition from an on-state to an off-state responsive to a transition of a gate voltage of the first switch from zero to the first voltage; and
the third switch is further configured to transition from an on-state to an off-state responsive to a transition of a gate voltage of the third switch from zero to the first voltage after the transition of the gate voltage of the first switch from zero to the first voltage.

7. The wordline driver circuit of claim 6, wherein, during the transition from the power down mode to the active mode:
the second switch is further configured to transition from an off-state to an on-state responsive to a transition of the gate voltage of the second switch from zero to the first voltage;
the first switch is further configured to transition from an off-state to an on-state responsive to a transition of the gate voltage of the first switch from the first voltage to zero; and
the third switch is further configured to transition from an off-state to an on-state responsive to a transition of the gate voltage of the third switch from the first voltage to zero after the transition of the gate voltage of the first switch from the first voltage to zero.

8. A method of reducing leakage during a power down mode in a wordline driver circuit of a random-access memory (RAM), the method comprising:
disconnecting a first set of wordlines from a first voltage by turning off a first switch in a strap buffer that defines a header, wherein the strap buffer is in a pre-driver stage;
disconnecting a second set of wordlines from the first voltage by turning off a third switch in the strap buffer, wherein the third switch is connected between inverters and the first voltage; and
disconnecting the second set of wordlines from a second voltage by turning off a second switch in an input-output buffer that defines a footer, wherein the input-output buffer is in the pre-driver stage.

9. The method of claim 8, wherein the third switch opens a leakage path through NMOS gates of inverters within the first set of wordlines during the power down mode.

10. The method of claim 8, further comprising connecting the first set of wordlines to the second voltage via a fourth switch in the strap buffer.

11. The method of claim 10, wherein the fourth switch clamps VDDWL to 0 during the power down mode.

12. The method of claim 8, wherein gate voltages of the first and third switches are changed sequentially via delay circuitry.

13. The method of claim 12, further comprising, during a transition from an active mode to the power down mode:
dropping a gate voltage of the second switch from the first voltage to zero;
raising a gate voltage of the first switch from zero to the first voltage; and
raising a gate voltage of the third switch from zero to the first voltage after raising the gate voltage of the first switch.

14. The method of claim 13, further comprising, during a transition from the power down mode to the active mode:
raising the gate voltage of the second switch from zero to the first voltage;
dropping the gate voltage of the third switch from the first voltage to zero; and
dropping the gate voltage of the first switch from the first voltage to zero after dropping the gate voltage of the third switch.

15. A wordline driver circuit for a random-access memory (RAM), the wordline driver circuit comprising:
a pre-driver stage comprising:
a strap buffer defining a header and comprising a first switch that is configured to disconnect a first set of wordlines from a first voltage during a power down mode and a third switch that is connected between inverters and the first voltage and is configured to disconnect a second set of wordlines from the first voltage during the power down mode; and
an input-output buffer defining a footer and comprising a second switch that is configured to disconnect the second set of wordlines from a second voltage during the power down mode.

16. The wordline driver circuit of claim 15, wherein, during a transition from an active mode to the power down mode:

the first switch is further configured to transition from an on-state to an off-state responsive to a transition of a gate voltage of the first switch from zero to the first voltage; and the third switch is further configured to transition from an on-state to an off-state responsive to a transition of a gate voltage of the third switch from zero to the first voltage after the transition of the gate voltage of the first switch from zero to the first voltage.

17. The wordline driver circuit of claim 16, wherein, during the transition from the power down mode to the active mode:

the first switch is further configured to transition from an off-state to an on-state responsive to a transition of the gate voltage of the first switch from the first voltage to zero; and the third switch is further configured to transition from an off-state to an on-state responsive to a transition of the gate voltage of the third switch from the first voltage to zero after the transition of the gate voltage of the first switch from the first voltage to zero.

* * * * *